United States Patent [19]

Kwan et al.

[11] Patent Number: 5,879,994
[45] Date of Patent: Mar. 9, 1999

[54] SELF-ALIGNED METHOD OF FABRICATING TERRACE GATE DMOS TRANSISTOR

[75] Inventors: Sze-Hon Kwan, Sunnyvale; Izak Bencuya, San Jose; Steven P. Sapp, Felton, all of Calif.

[73] Assignee: National Semiconductor Corporation, Santa Clara, Calif.

[21] Appl. No.: 842,661

[22] Filed: Apr. 15, 1997

[51] Int. Cl.⁶ .................................................. H01L 21/336
[52] U.S. Cl. .......................... 438/268; 438/585; 438/975; 148/DIG. 126
[58] Field of Search .................... 438/975, 268, 438/585, 148, DIG. 126

[56] References Cited

U.S. PATENT DOCUMENTS

| | | |
|---|---|---|
| 3,972,756 | 8/1976 | Nagase et al. |
| 4,757,032 | 7/1988 | Contiero . |
| 4,853,345 | 8/1989 | Himelick ................................... 437/41 |
| 5,141,884 | 8/1992 | Kwon et al. . |
| 5,273,922 | 12/1993 | Tsoi .......................................... 437/41 |
| 5,338,693 | 8/1994 | Kinzer et al. . |
| 5,474,946 | 12/1995 | Ajit et al. . |
| 5,578,423 | 11/1996 | Bae . |
| 5,684,319 | 11/1997 | Hebert . |
| 5,728,593 | 12/1994 | Yun et al. . |
| 5,817,546 | 12/1995 | Ferla et al. . |

OTHER PUBLICATIONS

Naresh Thapar and B. J. Baliga, "A Comparison of High Frequency Cell Designs for High Voltage DMOSFETs", Proceedings of the 6th International Symposium on Power Semiconductor Devices & IC's., Davos. Switzerland, May 31 –Jun. 2, 1994, pp. 131–135.

Primary Examiner—Richard A. Booth
Assistant Examiner—Jonathan Hack
Attorney, Agent, or Firm—Limbach & Limbach L.L.P.

[57] ABSTRACT

An active mask is used to etch field oxide in active areas down to an n– epitaxial substrate. After gate oxide growth, a polysilicon layer is deposited and planarized. The active mask defines the polysilicon gate critical dimension for a terrace gate DMOS structure. The edges of the polysilicon gates are self-aligned to the edges of the thick terrace gate oxide. Because no interlayer alignment is required to delineate the polysilicon gate, the design need not provide for alignment tolerance. A non-critical mask is deposited overlapping the terrace oxide. An etch back to field oxide in exposed areas is performed. An oxide-selective etch is performed to reduce the oxide thickness in source regions. Self-aligned body implantation, body contact masking and implantation, and source masking and implantation are performed. A dielectric is deposited. A source contact mask is deposited and a contact etch is performed. Source metal is deposited, and passivation layer is formed. Gate-drain capacitance caused by polysilicon gate overlap of the substrate is minimized as the overlap is minimized. Because input capacitance is reduced, switching speed is increased. This self-aligned feature also results in a smaller cell pitch dimension and higher packing density. Therefore, the specific ON resistance is reduced and current driving capacity is also greatly elevated.

17 Claims, 4 Drawing Sheets

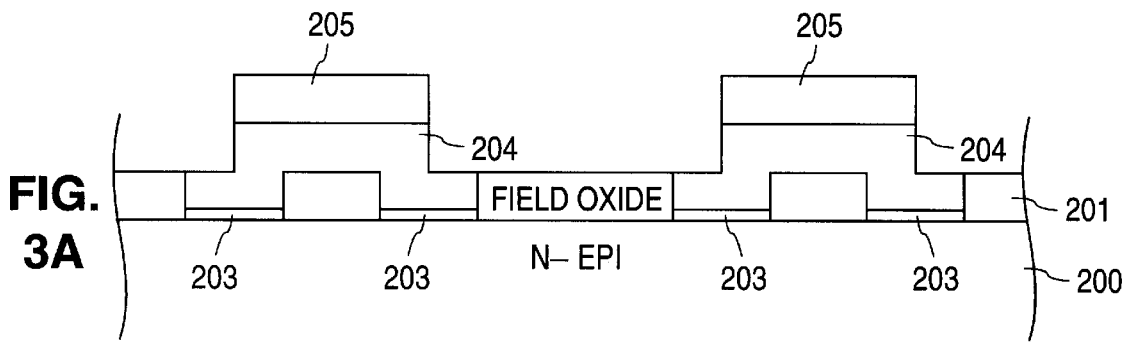
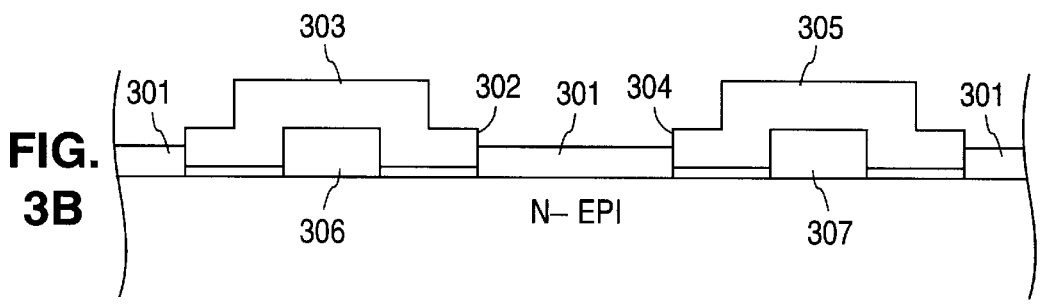
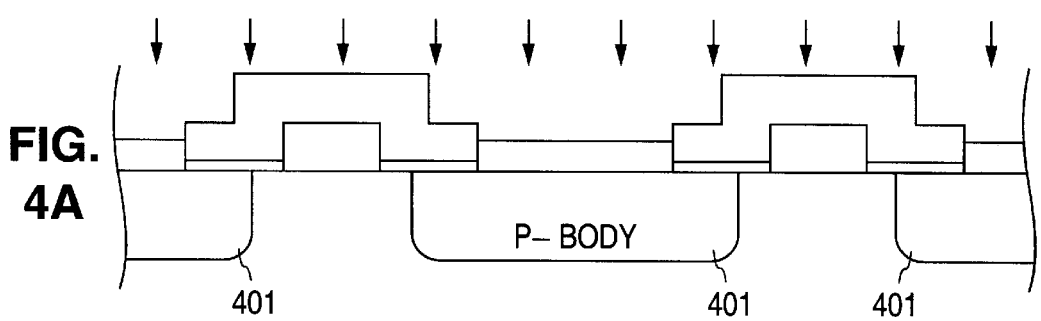
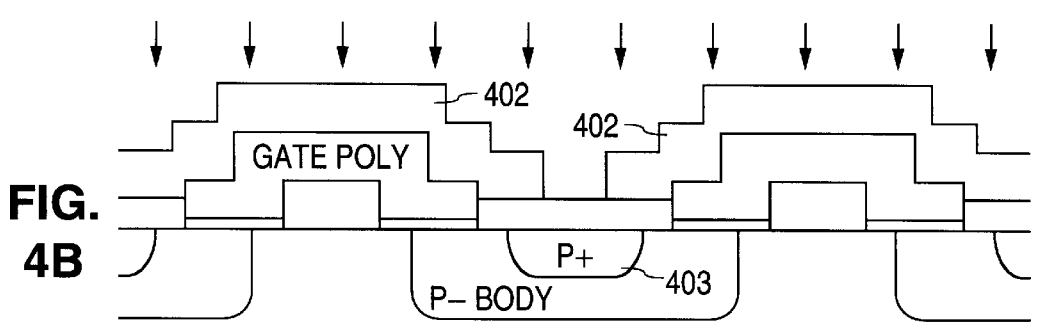
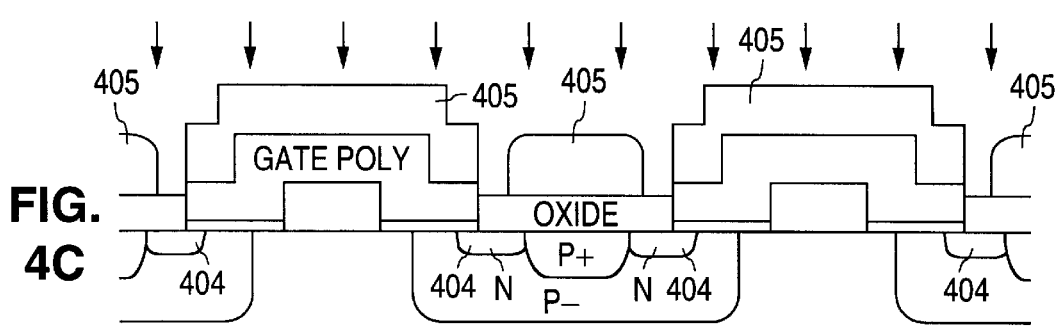

SELF-ALIGNED METHOD OF FABRICATING TERRACE GATE DMOS TRANSISTOR

BACKGROUND OF THE INVENTION

1. Field of the Invention

The present invention relates to fabrication methods for terrace gate DMOS transistors. Specifically, the present invention relates to the alignment and spacing of the terrace oxide and the polysilicon gate.

2. Discussion of the Related Art

To reduce the conduction and switching losses in a MOSFET, it is desirable to reduce the specific ON resistance and the specific input capacitance. The purpose of the terrace gate is to reduce the capacitance between the gate and the source, thus allowing the DMOS device to switch faster. The gate capacitance is caused by the overlap of the polysilicon gate to the substrate. The polysilicon gate overlaps the substrate over the thin gate oxide and the thick terrace oxide. In a capacitor, the capacitance is inversely proportional to the separation of the plates. The terrace oxide separates the polysilicon from the substrate in the regions where no inversion layer is needed at the surface of the substrate, thus reducing the gate capacitance without affecting control of the channel. There is no channel directly beneath the terrace oxide.

However, in conventional DMOS terrace gate methods, the reduction in gate capacitance caused by introducing the terrace gate is somewhat offset by an increase in gate capacitance caused by gate dimension margins added for mask alignment, as discussed below.

FIGS. 1A through 1D illustrate a conventional DMOS terrace gate fabrication method. In FIG. 1A, an N− substrate 100 has a field oxide layer 101 formed on top. A photoresist layer 102 defines the terrace oxide. FIG. 1B illustrates the terrace oxide 101 after an etch back to the substrate 100.

As illustrated in FIG. 1C, after a gate oxide 103 growth and a polysilicon 104 deposition, a second photoresist mask 105 is formed. The photoresist mask 105 must be carefully aligned to the terrace oxide 101. The gate dimension (GD) represents the length of the gate which will be used for the channel region from a source 106 (FIG. 1D) in the DMOS transistor pairs. This dimension is very important in determining transistor threshold voltage, ON resistance, and other characteristics. The gate separation distance (GS) represents the required minimum polysilicon separation. Because the second photoresist mask 105 must be aligned to the existing terrace oxide 101, the gate dimension GD of the design is increased by a mask alignment tolerance. The mask alignment tolerance is approximately 0.2 to 0.3 microns in modern process technology.

Because the photoresist mask 105 must overlap the polysilicon edge 107 by at least a minimum alignment tolerance determined by photolithography, the lateral thickness of the polysilicon 104 around the terrace oxide places a minimum constraint on the gate dimension.

FIG. 1D illustrates a partial DMOS structure fabricated according to conventional techniques. The structure shown in FIG. 1D illustrates a two DMOS structure. FIG. 1D does not illustrate, for example, the interconnection of the polysilicon gates which occurs in other portions of the circuit layout.

Normally, the gate dimension (GD) of a conventional DMOS terrace gate cell is around 4 or 5 microns. Each alignment tolerance is around 0.2 or 0.3 microns, not including etch dimension changes and critical dimension variations. The total alignment margin which must be added to the gate dimension to accommodate for alignment becomes around 0.5 to 0.6 microns per side, or about 1.2 microns total in a 4 to 5 micron structure. Therefore, an overhead of over 30% is added in the lateral dimension to accommodate for the critical mask alignment. In two-dimensional circuit layout, where area is the metric of concern, dimension increases are squared to determine area increase due to margin. Thus, a 30% one-dimensional increase corresponds to a 69% area increase.

Moreover, the device geometries are decreasing in feature size more rapidly than photolithographic mask alignment tolerances. Therefore, as cell densities become higher, each 0.3 micron mask alignment becomes a higher percentage of the total pitch. All of the feature sizes are becoming compressed as the technology develops greater levels of miniaturization.

The need exists for a self-aligned method of forming DMOS terrace gates because the pitch sizes are reduced to less than the alignment margins, thus rendering it impossible to construct using photolithographic techniques while maintaining adequate performance, because there simply is not enough room to accommodate photolithographic alignments. Moreover, if the capacitance added by necessary photolithographic margins is greater than the reduction in gate capacitance caused by using the terrace gate, then terrace designs are no longer desirable. Many feature sizes are so small that this point of diminishing return has been reached.

As is apparent from the above-discussion, a need exists for a self-aligned terrace gate DMOS transistor fabrication method. In order to reduce conduction and switching losses in MOSFET power devices, the reduction of the on-resistance and reduction of input capacitance are desired. A need for reliable fabrication of uniform DMOS transistors exists. Reduction of cell pitch helps achieve these objectives.

SUMMARY OF THE INVENTION

In order to reduce conduction and switching losses in MOSFET power devices, the reduction of the on-resistance and reduction of input capacitance are desired. One objective of the present invention is to provide a terrace gate fabrication method in which channel length is precisely controlled. Another object of the present invention is to reduce cell pitch. Yet another object of the present invention is to reduce gate capacitance. Still another object of the present invention is to eliminate photolithographic alignment margins from layout design, thus allowing applications to very high density DMOS arrays with small cell pitches.

According to the present invention, an active mask is used to etch a thick field oxide in active areas down to an n− epitaxial substrate. After gate oxide growth, a polysilicon layer is deposited and planarized. The active mask defines the polysilicon gate critical dimension for a terrace gate DMOS structure. The edges of the polysilicon gates are self-aligned to the edges of the thick terrace gate oxide. Because no interlayer alignment is required to delineate the polysilicon gate, the design need not provide for alignment tolerance. A non-critical mask is deposited overlapping the terrace oxide. An etch back to the field oxide in exposed areas is performed. The field oxide edge determined in the active mask determines the lateral extension of the polysilicon gate toward the DMOS source. The alignment of the terrace oxide and gate polysilicon using a single active mask is the essence of the present invention.

In a preferred embodiment of the present invention, an oxide-selective etch is then performed to reduce the oxide thickness in source regions. A self-aligned body implantation is performed, followed by heavy body masking and implantation. Then source masking and implantation are performed. A dielectric, preferably borophosphosilicate (BPSG) or phosphosilicate glass (PSG), is then deposited. A source contact mask is deposited and a contact etch is performed. Source metal is deposited, and a passivation layer is formed.

The present invention accomplishes several significant objectives. Gate-source capacitance caused by polysilicon gate overlap of the substrate is minimized as the overlap is defined and minimized in the design of the active mask. Because input capacitance is reduced, switching speed is increased. The self-aligned feature of the polysilicon gates also results in a smaller cell pitch dimension and higher packing density. Therefore, the specific ON resistance is reduced and current driving capacity is also greatly elevated.

These and other features and advantages of the present invention will be apparent from the Drawings as fully explained in the Detailed Description of the Invention.

BRIEF DESCRIPTION OF THE DRAWINGS

In FIG. 1A, the terrace oxide mask is shown over the field oxide and a substrate. FIG. 1B shows the terrace oxide after etching. FIG. 1C illustrates the gate polysilicon layer and its mask. FIG. 1D illustrates a terrace gate DMOS fabricated according to the conventional method using a separate terrace oxide mask and a polysilicon gate mask.

FIG. 2A illustrates the active mask over the field oxide according to the present invention. FIG. 2B illustrates the field oxide pattern following an anisotropic etch. FIG. 2C illustrates the growth of a thin gate oxide. FIG. 2D illustrates the deposition of a planarized polysilicon layer. FIG. 2E illustrates a non-critical photoresist mask protecting the gate polysilicon.

FIGS. 3A and 3B illustrate the fundamental steps of the terrace gate fabrication method according to the present invention. FIG. 3A illustrates the self-aligned polysilicon gates formed by a masked etch. FIG. 3B illustrates the resulting structure after an oxide-selective etch.

FIGS. 4A through 4C illustrate the remaining steps necessary for implantation of all DMOS transistor regions according to a preferred embodiment of the present invention. FIG. 4A illustrates the channel region implantation. FIG. 4B illustrates the heavy body contact implant. FIG. 4C illustrates the source region implantation.

FIG. 5A illustrates the deposition of an insulator and source contact mask. FIG. 5B illustrates the completed DMOS structure according to a preferred embodiment of the method of the present invention.

The Figures are thoroughly explained in the Detailed Description of the Invention.

DETAILED DESCRIPTION OF THE INVENTION

According to the present invention, a DMOS transistor is formed featuring a terrace gate structure where the edges of the polysilicon gate are self aligned to the terrace gate oxide. This special feature reduces the gate capacitance significantly which results in a faster switching speed for this device. This self aligned feature also gives rise to a smaller cell pitch dimension and a higher packing density. Therefore, the specific on resistance (specific resistance from drain to source when gate is on) of this device is improved significantly over conventional methods. The details of this device are described in the following. Although the present invention is described and illustrated with reference to an n-channel DMOS device, the present invention is not limited to n-channel DMOS, i.e., p-channel DMOS can also be fabricated according to the methods of the present invention.

Figure 1A:
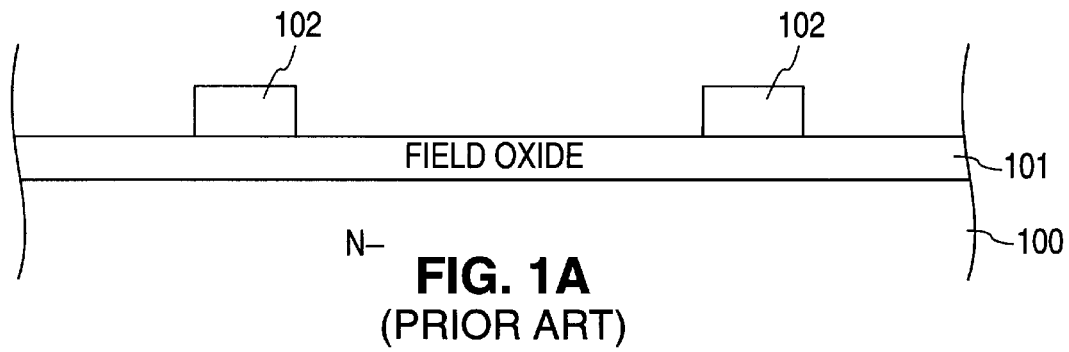
FIGS. 1A through 1D illustrate a conventional terrace gate fabrication process.
Figure 1B:
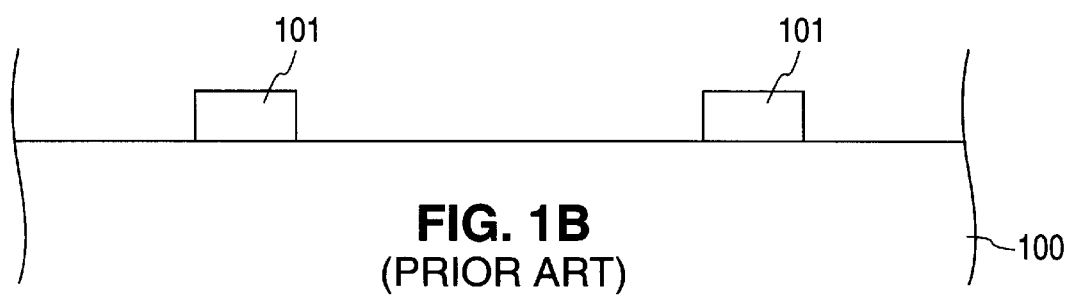
Figure 1C:
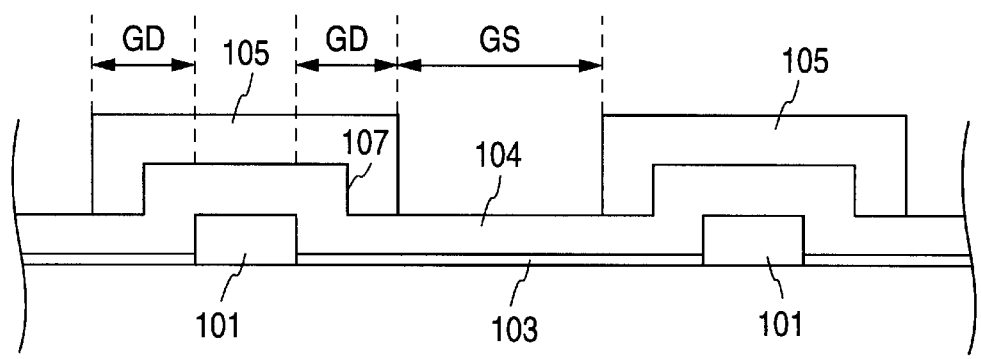
Figure 1D:
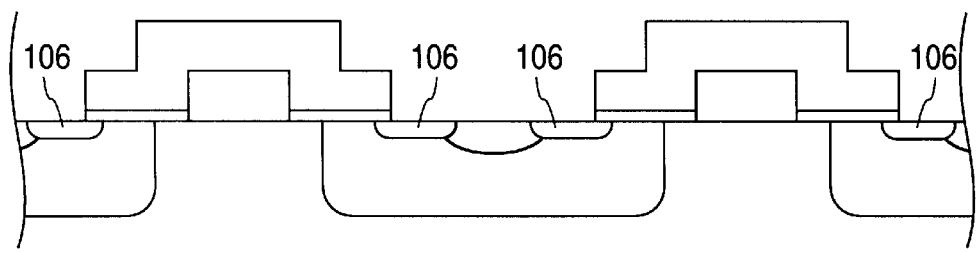
Figure 2A:
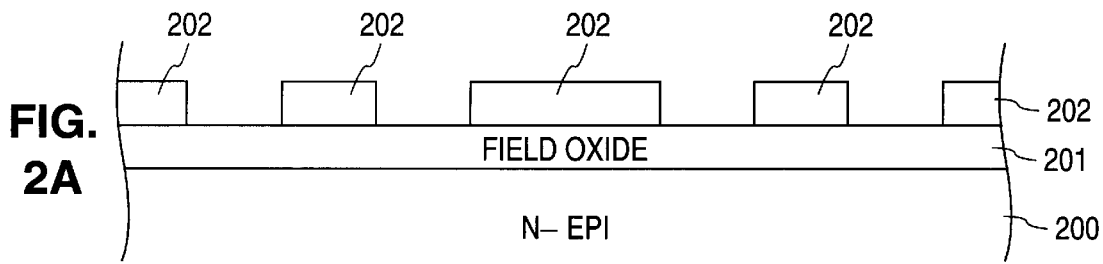
FIGS. 2A through 2E illustrate several steps of the terrace gate fabrication method according to the present invention.

As illustrated in FIG. 2A, in a preferred embodiment, the starting material is a lightly doped thin n– epitaxial layer 200 grown on a heavily doped n+ substrate (not shown). A thick field oxide 201 is thermally grown on the n– epitaxial layer 200. A photoresist active mask 202 is formed on the field oxide 201 by conventional photolithography so as to expose device active regions in the underlying epitaxial active layer 200.

Figure 2B:
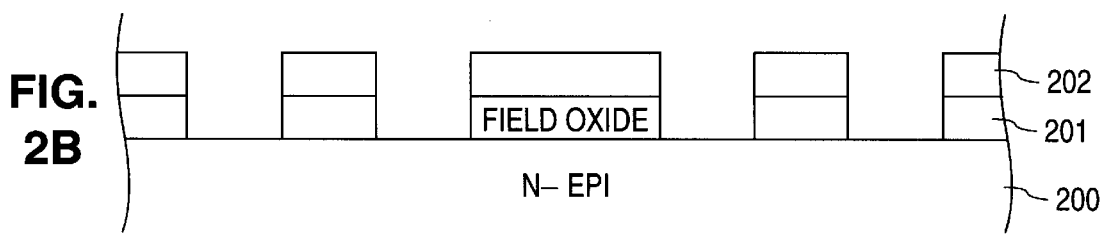

As illustrated is FIG. 2B, in a preferred embodiment, a dry, anisotropic etch is then performed to remove the areas of field oxide 201 that are not protected by the photoresist mask 202. The present invention is not limited to a dry active etch back to the epitaxial surface; therefore, various wet etches can alternatively be performed to create the active area. However, by using an anisotropic, highly directional etch, the critical dimension can be made smaller and with less variance; therefore, a preferred method uses a vertical anisotropic dry etch. The active photoresist mask 202 is then stripped away.

Figure 2C:
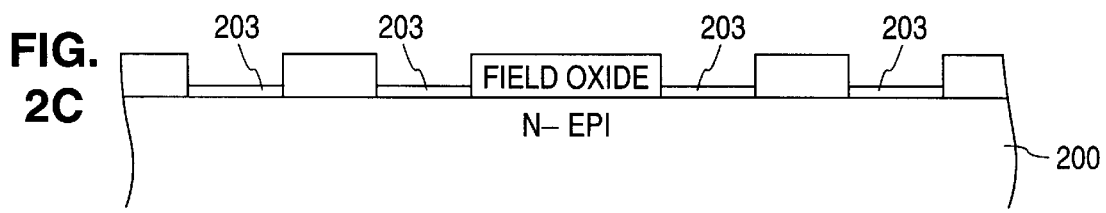
Figure 2D:
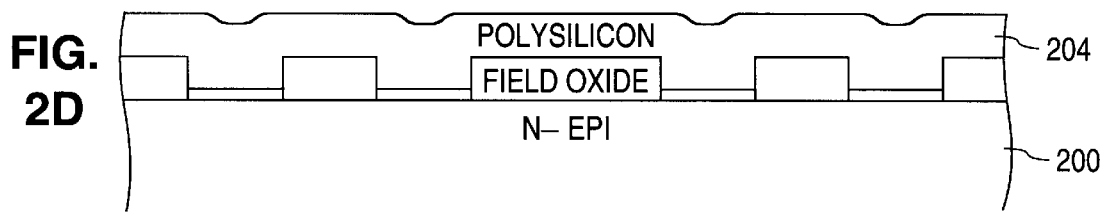

FIG. 2C illustrates the next major sequence, in which a thin layer of gate oxide 203 is then thermally grown. In FIG. 2D, a polysilicon layer 204 is deposited which fills the active gate area and planarizes the surface. The planarization is achieved by depositing a polysilicon layer with thickness approximately equal to the width of the active gate openings. For example, in a practical application, if the active areas are 1.5 microns wide, the polysilicon layer 204 must be deposited to a thickness of at least 1.5 microns above the thick field oxide 201 to achieve adequate planarization, so that the polysilicon layer 204 is approximately the same height in the areas above the active gates and in the areas above the field oxide 201.

During low-pressure chemical vapor deposition (LPCVD), polysilicon grows not only upward on the surface of the field oxide, but also sideways on the vertical edges of the field oxide. The result of the omni-directional growth results in wedges building up over the active regions. By growing the polysilicon to a thickness equal to the width of the active region, the wedges are guaranteed to contact each other and form a thicker polysilicon layer above the active region than above the field oxide. The polysilicon layer 204 covers both the gate oxide 203 and the thick field oxide 201.

Once planarization is achieved, the polysilicon layer is reduced to a usable thickness. The thick polysilicon layer 204 is then etched back to about 5000 Angstroms above the field oxide surface and is doped to obtain the required sheet resistivity. After the polysilicon 204 is in place and if undoped polysilicon was deposited, it is doped with a high concentration of N type impurities. According to a preferred embodiment, this doping step is performed by POCl$_3$ doping. However, the doping step may be performed in a number of alternative ways: the N type dopant can be implanted; it can be en-situ doped, or in other words, doped simultaneously with being deposited or grown; or, alternatively, a compound (not shown) containing the dopant, for example POCl₃, can be deposited after the polysilicon 204 deposition, after which the dopant (Phosphorous [P] in this example) diffuses down into the polysilicon 204.

Figure 2E:
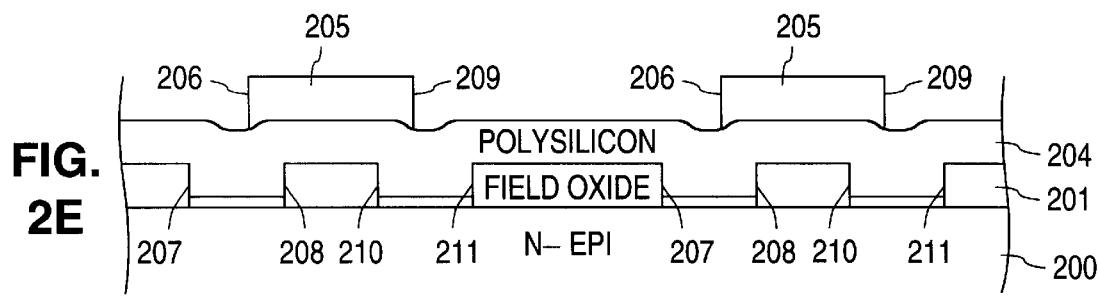

As illustrated by FIG. 2E, a photoresist mask layer 205 for the polysilicon layer 204 is formed by conventional photolithography. The exposed polysilicon 204 is then etched down to the field oxide surface 201 to isolate the polysilicon gate material. As illustrated in FIG. 3A, the thickness of the field oxide 201 allowed removing the thinner portions of the polysilicon layer while still allowing the polysilicon 204 to overlay the thinner gate oxides 203.

A significant feature of the present invention is that the alignment of the polysilicon photoresist mask 205 is non-critical and has no influence on the critical dimension of the DMOS structure. Referring to FIG. 2E, as long as the left edges 206 of the polysilicon photoresist 205 are laterally positioned somewhere between the right edges 207 of the field oxide and the left edges 208 of the terrace oxide, the DMOS device will function properly. Similarly, as long as the right edges 209 of the photoresist mask 205 are laterally positioned somewhere between the right edges 210 of the terrace oxide and the left edges 211 of the gate separation area field oxide, the DMOS device will function as designed. Thus, the polysilicon photoresist mask 205 does not influence the critical dimension of the DMOS array. The critical dimension determines the minimum separation between rows in an array of the devices, and is determined only by the active mask thus eliminating additional alignment tolerances.

The dimension of the DMOS polysilicon gate regions having thin gate oxide is determined by the initial active mask. The gate dimension is an important device parameter which needs to be reliably controlled in order to guarantee correct operation for smaller devices. If, as by conventional methods, the polysilicon gate dimension were determined by a separate mask other than the one used to form the terrace oxide, then an alignment tolerance must be added to the gate dimension, thereby increasing a hysical critical dimension, expanding the cell pitch, and adding variance to the mportant device parameter. On the other hand, according to the present invention the gate dimension is precisely controlled by the active mask, thereby allowing the gate dimension to be both uniform and well controlled. By producing a well controlled gate dimension defined wholly by the active mask, more precise device characteristics are achieved.

The polysilicon photoresist masking layer 205 is non-critical with respect to critical dimension (CD) and alignment as compared to conventional DMOS structures. In prior art DMOS structures, such as illustrated in FIGS. 1A–1D, the alignment of the gate polysilicon mask contributes to the critical dimension and thus increases the pitch of the cell. In the present invention, both the critical dimension and the alignment for the polysilicon gate are self-defined by the design layout in the active mask 202 illustrated in FIG. 2A.

Referring now to FIG. 3B, the field oxide areas 301 which are cleared of polysilicon are then etched down to a thickness about a few hundred Angstroms from the silicon surface. In a preferred embodiment, an oxide selective etch is performed so that the final height of the polysilicon is significantly higher that the etched field oxide 301. For example, the etch might reduce the thickness of the field oxide ten times as much as the thickness of the polysilicon. If the field oxide were reduced in thickness from 5000 Angstroms to 500 Angstroms, then the polysilicon would be etched by 450 Angstroms.

The utmost advantage of the present invention is that the edges of the gate polysilicon 204 are self-aligned to the edges of the thick terraced gate oxide 201. The critical dimension of the gate polysilicon is defined also by the previous active mask 202. In other words, the lateral separation of the rightmost edge 302 of the polysilicon gate 303 from the leftmost edge 304 of the polysilicon gate 305 is also defined by the active mask 202.

The self-aligned features combined with the thick terraced gate oxide 306 and 307 enable the gate capacitance to be minimized according to the present invention. The most general embodiment of the present invention includes a method to produce the structure illustrated in FIG. 3B and is not limited to any specific processing of the devices subsequent to the step illustrated in FIG. 3B. Although a preferred embodiment of the processing subsequent to FIG. 3B is described, that embodiment is offered by way of example, not by way of limitation. After the structure illustrated in FIG. 3B has been formed, a more elaborated DMOS process flow could be employed without departing from the spirit and scope of the present invention. For example, a silicide layer could be introduced to reduce gate resistance.

Referring now to FIG. 4A, the channel area and body regions are formed by blanket implanting Boron typically and drive-in diffusion. The polysilicon gates 303 and 305 serve as masks during the Boron implantation leading to the formation of the P– body regions 401. As illustrated in FIG. 4B, a photolithographic mask 402 is defined in order to implant the heavy body region 403. The heavy body 403 is formed by implanting Boron typically and drive-in diffusion as shown in FIG. 4B. The heavy body enhances the surface concentration or dopants and provides a good ohmic contact. The source regions 404 are defined by a photolithographic mask 405, and formed by implanting Arsenic typically and drive-in diffusion as shown in FIG. 4C.

Figure 5A:
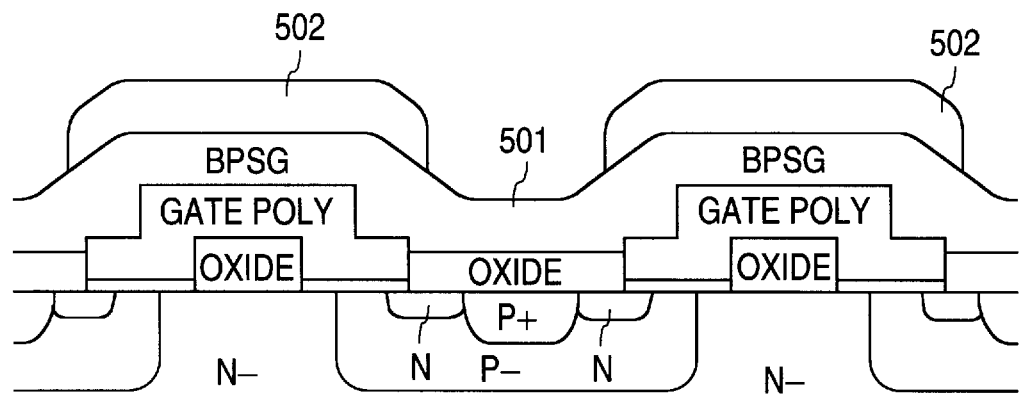
FIGS. 5A and 5B illustrate the addition of the final layers above the substrate according to a preferred embodiment of the present invention.

After the mask 405 is stripped away from the structure of FIG. 4C, referring now to FIG. 5A, a dielectric interlayer 501 is deposited (typically BPSG or PSG). Then a photolithographic mask 502 is defined to expose source contact openings.

Figure 5B:
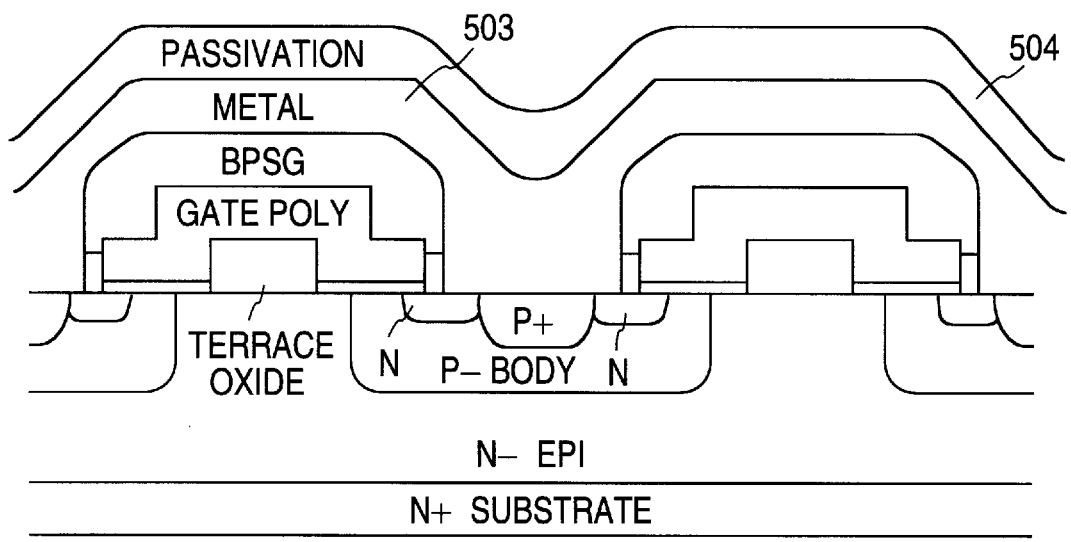

FIG. 5B illustrates a typical finished DMOS structure made in accordance with the methods of the present invention. Contact openings are etched as shown in FIG. 5B, and a metal deposition adds the source contacts through metal layer 503. A photolithographic masking step and subsequent metal etching are performed (not shown) to delineate the metal for source, field plate, and gate. A passivation layer 504 is deposited as shown in FIG. 5B. A photolithographic mask (not shown) is used to delineate the bond pads. This is followed by an unshown alloy step.

In order to form the DMOS drain contacts, the substrate is thinned down to the required thickness and the back side is metallized to form the back side drain contact. The above discussed device structure and process flow are used in an n-channel device and are for illustration purposes only, i.e., p-channel devices can also be constructed similarly by adopting the opposite material and dopant types. The illustrations used here show only the cross section of the active DMOS transistor cell using a typical process flow. The scope of the present invention includes variations on fabrication process flows and more details on cell and chip layout design alternatives.

While the present invention has been disclosed with particular reference to preferred embodiments, those embodiments are presented by way of example, not by way of limitation. Those of ordinary skill in the art would be enabled by this disclosure to add to or modify the embodiment of the present invention in various ways as needed and still be within the scope and spirit of the present invention as recited in the appended claims. Accordingly, various changes and modifications which are obvious to a person skilled in the art to which the invention pertains are deemed to lie within the spirit and scope of the invention as claimed.

What is claimed is:

1. A method of fabricating a terrace gate DMOS transistor comprising the steps of:

providing a semiconductor substrate having a substrate surface containing impurities of a first conductivity type;

forming a field oxide layer on the substrate surface;

forming a first photoresist mask on the field oxide layer, thereby defining first mask protected areas and first mask exposed areas, wherein the first mask protected areas include a terrace gate area and a device gate separation area, and wherein the first mask exposed areas include a device active area;

performing an etch of the field oxide layer through the first photoresist mask within the first mask exposed area to the substrate surface;

forming a thin layer of gate oxide on the substrate surface within the device active area;

depositing a polysilicon layer;

forming a second photoresist mask on the polysilicon layer, thereby defining second mask protected areas and second mask exposed areas, wherein the second mask protected areas fully overlie the terrace gate area such that the second mask protected area is larger than the terrace gate area and overlaps the terrace gate area by a non-zero overlap distance, and wherein the second mask exposed area includes the gate separation area; and etching the polysilicon layer so as to fully remove it within the gate separation area, thereby exposing the field oxide layer.

2. A method as in claim 1, wherein the step of depositing a polysilicon layer includes depositing a polysilicon layer at least as thick as a device action area width, and wherein the method further comprises the step of, after the step of depositing the polysilicon layer, etching the polysilicon layer down to a polysilicon gate thickness.

3. A method as in claim 2, wherein the polysilicon gate thickness is approximately 5000 Angstroms.

4. A method as in claim 2, further comprising the step of performing an etch, thereby substantially reducing field oxide layer thickness within the gate separation area.

5. A method as in claim 4, further comprising the step of performing a thermal oxidation to form an implant oxide layer in the gate separation area.

6. A method as in claim 2, further comprising the steps of:

implanting impurities of a second conductivity type into the gate separation area; and performing a drive-in diffusion heat cycle so as to form a channel region and a lightly-doped body region of a second conductivity type.

7. A method as in claim 2, further comprising the steps of:

forming a third photoresist mask exposing a heavy body implant region; and implanting impurities of a second conductivity type through the third mask to form a lightly doped body region.

8. A method as in claim 7, further comprising the steps of:

forming a fourth photoresist mask exposing source implant regions; and implanting impurities of a first conductivity type through the fourth photoresist mask to form source regions within the lightly doped body region.

9. A method as in claim 8, further comprising the step of depositing a dielectric interlayer.

10. A method as in claim 9, further comprising the steps of:

forming a fifth photoresist mask exposing source contact regions; and etching the dielectric interlayer and oxide in the source contact regions back to the substrate surface.

11. A method as in claim 10, further comprising the step of depositing a source metal layer.

12. A method as in claim 6, wherein the first conductivity type is n type, and the second conductivity type is p type.

13. A method as in claim 12, wherein the step of providing a semiconductor substrate includes the steps of:

providing a heavily doped substrate of a first conductivity type; and forming an epitaxial layer of the first conductivity type on the heavily doped substrate, such that the epitaxial layer has a lower doping concentration than the heavily doped substrate.

14. A method as in claim 13, wherein the forming of the epitaxial layer is performed by vapor-phase growth.

15. A method as in claim 2, wherein the step of performing an etch of the field oxide layer through the first photoresist mask includes an anisotropic etch.

16. A method as in claim 4, wherein the step of performing an etch includes performing an oxide-selective etch, such that field oxide layer thickness is decreased without affecting the polysilicon layer thickness.

17. A method as in claim 9, wherein the step of depositing a dielectric interlayer includes depositing phosphosilicate or borophosphosilicate glass.

* * * * *